United States Patent [19]
Ho

[11] Patent Number: 5,363,419
[45] Date of Patent: Nov. 8, 1994

[54] DUAL PHASE-LOCKED-LOOP HAVING FORCED MID RANGE FINE CONTROL ZERO AT HANDOVER

[75] Inventor: Kenneth S. Ho, Cupertino, Calif.

[73] Assignee: Advanced Micro Devices, Inc., Sunnyvale, Calif.

[21] Appl. No.: 873,310

[22] Filed: Apr. 24, 1992

[51] Int. Cl.$^5$ .............................................. H03D 3/24
[52] U.S. Cl. .................... 375/120; 331/1 A; 331/25; 331/14
[58] Field of Search ............... 375/120; 331/1 R, 1 A, 331/10, 11, 16, 17, 18, 25, 42, 14

[56] References Cited

U.S. PATENT DOCUMENTS

| | | | |
|---|---|---|---|
| 4,272,729 | 6/1981 | Riley, Jr. | 331/1 A |
| 4,965,533 | 10/1990 | Gilmore | 331/18 |
| 5,015,970 | 5/1991 | Williams et al. | 331/11 |

*Primary Examiner*—Stephen Chin
*Assistant Examiner*—Don Vo
*Attorney, Agent, or Firm*—Gerald Fisher

[57] ABSTRACT

Method and apparatus for controlling a PLL so that handover between fine and coarse loops take place at 2.5% of the nominal VCO frequency and where the coarse and fine loops error are combined in a summer circuit which employs a series circuit having a P-channel and N-channel FET with common drains and where the drains connected to the summer output node.

6 Claims, 7 Drawing Sheets

DUAL PHASE-LOCKED-LOOP HAVING FORCED MID RANGE FINE CONTROL ZERO AT HANDOVER

FIELD OF INVENTION

This invention relates to phase locked loop (PLL) coarse and fine loop control improvements.

BACKGROUND OF THE INVENTION

Phase locked loops (PLL) are employed for many applications in electronics. One of the most common application is to provide a timing signal which is synchronized with another signal. PLL also are widely used in data separators for bit recovery. Generally, a phase locked loop consists of a variable frequency oscillator, called a VCO, in which the VCO output is compared to the signal to which it is being synchronized and the error in phase and frequency is fed to a low pass filter. The output of the low pass filter drives the VCO to servo it to minimize the error. So called two speed servo control is known in PLL to provide a coarse and fine control which enables high speed feedback closure on the minimum error, i.e., the lock state. U.S. Pat. Nos. 5,015,970 and 4,847,876 disclose such a system employing a digital coarse control and an analogue fine control.

Two speed PLL systems employing a high speed digital coarse control and a slower analogue system for fine control usually provide that the digital coarse control range is smaller than the range of the analogue control. This is to assure that the fine control can correct across the entire range of the coarse control. Occasionally, this system can lose control when the analogue control is in its limit in one direction and the digital coarse control signal is not large enough to override the analogue control.

SUMMARY OF THE INVENTION

It is an object of this invention to provide a two speed PLL which cannot become locked in an extreme.

It is a still further object of this invention to provide a two speed PLL having a means to position and maintain the fine control loop at its mid-range signal value whenever the digital coarse control system is in control.

It is a further object to provide a quick acting digital coarse control which will not over correct the frequency error and an independent analogue control loop which can provide a lower jitter.

It is a feature of the invention that the operational frequency is extremely wide without changing the loop parameters.

It is a further feature that the lock time from start up can be on the order of microseconds for a 25 MHz external clock.

DETAILED DESCRIPTION OF THE INVENTION

Figure 1:
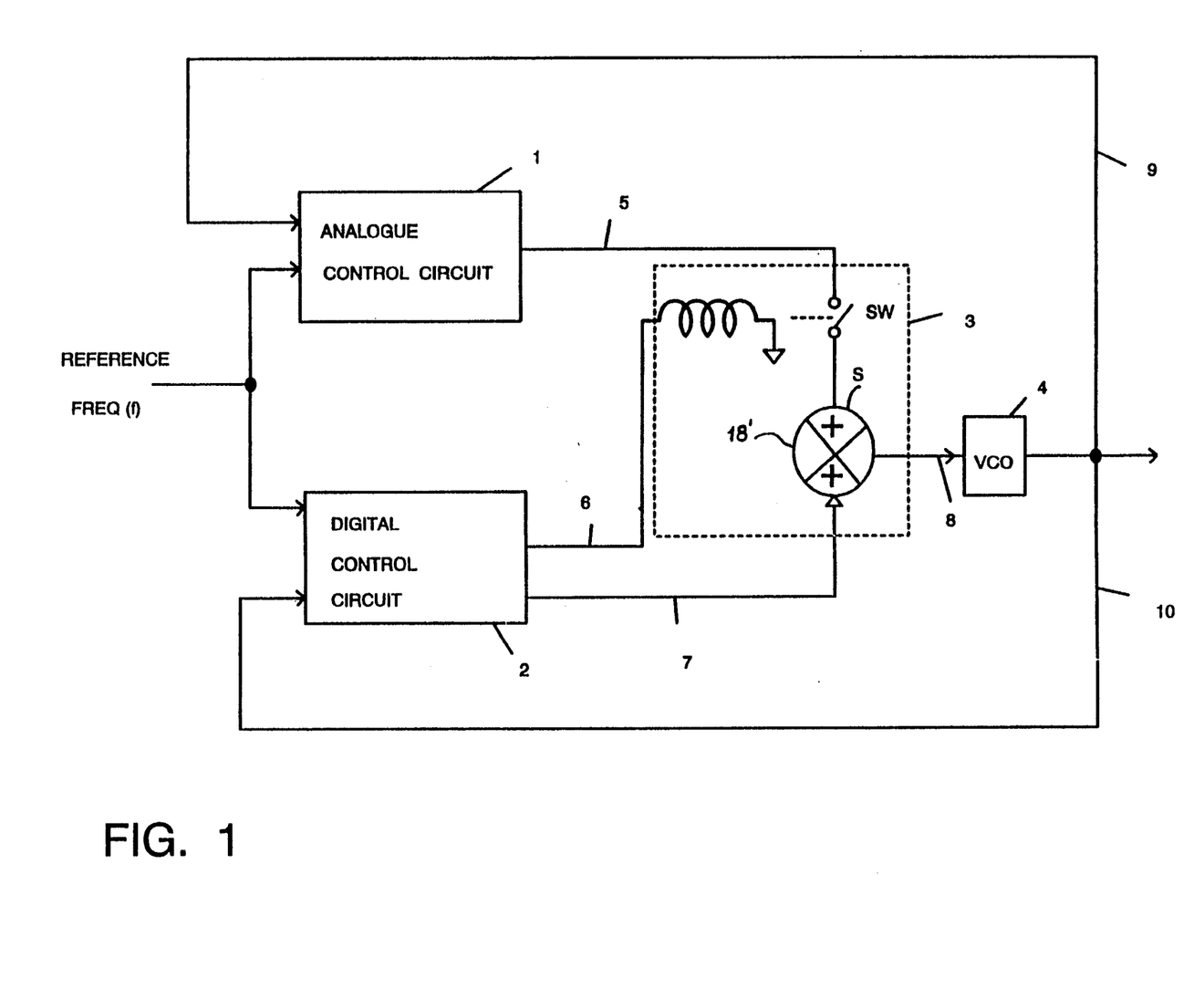
FIG. 1 is a block diagram of the novel PLL.

With reference to FIG. 1, the two speed phase lock loop of my invention is disclosed in an embodiment for producing a low jitter, high frequency at the output of VCO 4 which is phase lock synchronized to a lower frequency reference (f) and which is a fixed multiple of the lower frequency reference. In this embodiment, the fixed multiple is 5, i.e., the VCO is running at 5 f and f=25 MHz.

The Digital Control Circuit 2 is the coarse control loop which provides two control signals to the combiner circuit 3. The control signal on line 6 to the switch (SW) in the combiner 3 is shown symbolically to be capable of disconnecting the fine control circuit from the Analogue Control circuit on line 5 from the summer 5, in combiner 3. In the actual circuit, the analogue circuit is zeroed when the coarse loop is in control so that the signal from the analogue control circuit 1 can be applied to the summer 18' without effect. The Digital Control Circuit 2, compares the frequency of the REFERENCE FREQ to the VCO frequency, and if their frequencies are within a specified predetermined tolerance, i.e., ±2.5% in this case, it sends the control signal 6 to the combiner which causes handover, i.e., the analogue control signal takes over control of the PLL loop and drives the VCO to the fine phase and frequency lock.

A principal function of the combiner block 3 is to adjust the analogue control signal so that the analogue control signal is always started at the center of its adjustment range when handover occurs.

Figure 2:
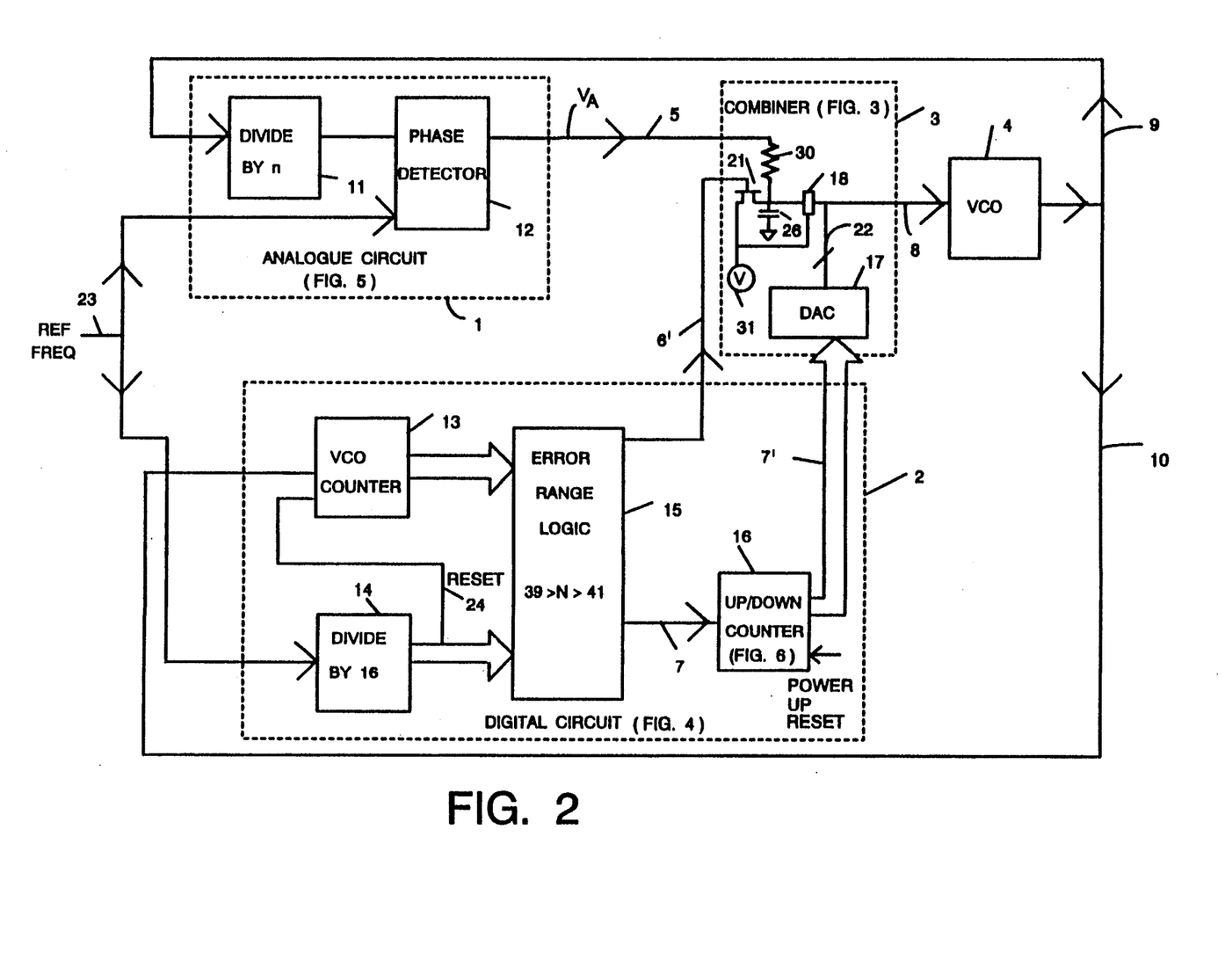
FIG. 2 is a schematic block diagram further depicting the elements of the blocks of FIG. 1.

The control signal 7 output of the digital control circuit is most conveniently the digital output of a register which is converted in a Digital to Analogue Converter (DAC) 17, FIG. 2, to a current to be added to the analogue current for control of the VCO.

With reference to FIG. 2, the sub-block interconnection of the blocks of FIG. 1 are illustrated. Digital Control circuit 2 consists of a VCO counter 13, a Divide by 16 circuit 14, (or other appropriate denominator) Error Range Logic 15 and an UP/DOWN counter 16. The VCO counter 13 is reset on line 24 by the divide by 16 counter 14 at state 6 and counts during the time from states 7 through 14 of the divide by 16 counter. The Error Range Logic 15, decides whether state 15 of the divide by 16 counter occurs before the VCO counter 13 reaches thirty nine (39) counts. The nominal count on VCO counter 13 would be forty (40) if the VCO frequency was 5* REF FREQ, since the divide by 16 counter permitted it to count for 8 cycles (5×8=40). Accordingly, if the count is 39 or less, the VCO is at least 2.5% slow and the Digital Control Loop will retain control and will generate an up signal command to increment the UP/DOWN counter 16. Counter 16 sends a digital command on bus 7' to the DAC 17 in combiner 3. The Error Range Logic circuit 15 sends a down signal to the up/down counter if the VCO counter registers 41 or greater during the 8 count period of the divide by 16 counter. This represents a VCO frequency 1/40 too fast or 2.5% from nominal, and the coarse digital control circuit would take over exclusive control or retain it by maintaining an active high on line 6'.

After handover of control to the fine control analogue circuit and during the time that the divide by 16 circuit 14 is in the counter states 1 through 6, the coarse control logic is ineffective. This provides the fine loop a period of exclusive control irrespective of frequency difference during which time the coarse control cannot take back the control.

The combiner circuit 3 is shown to be connected to control line 6', FIG. 2, such that when line 6' goes high the FET switch 21 closes the circuit to connect the capacitor 20 directly to source voltage V. This is not the actual control circuit configuration of combiner 3 but is illustrative of the logic. Specifically, in the combiner 3, whenever the digital circuit senses that the frequency is out of range, i.e., greater than ±2.5%, the analogue circuit is disabled by forcing to zero the analogue circuit contribution to the signal on line 8 by adjusting the analogue control signal to its mid-range value. This is illustrated in conjunction with element 18 in the combiner which is also connected to the voltage source V. As will be more fully explained subsequently, elements 30, 21, 31 and 18 process the analogue signal so that it is at its mid-range, i.e., I=0, when the Digital Control circuit is in command of the loop.

On Power up, the reset on the UP/DOWN counter 16 causes the counter output 7' to be set to a value which is expected to be close to the signal current level required to operate the VCO at its nominal frequency.

The analogue circuit 1 of FIG. 2, contains a standard divide by 5 circuit 11 which divides the VCO output on line 9 and feeds the lower frequency pulse on line 11 to the phase detector 12. Also input to phase detector 12 is the reference frequency 23. The phase detector 12 provides a charge up or charge down current on line 5 to the combiner 3 as the analogue control whenever the circuit senses a phase error between the two inputs.

Figure 3:
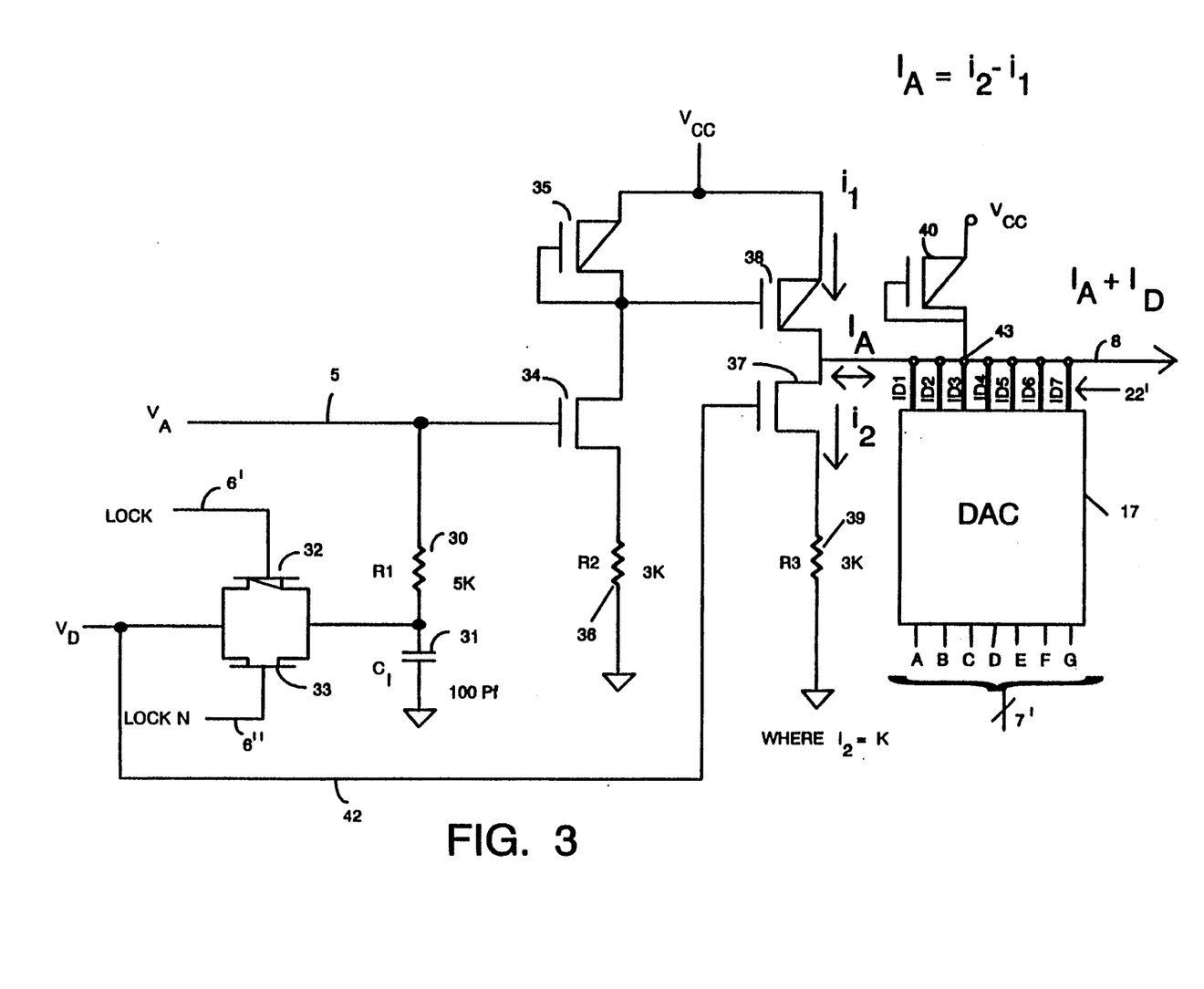
FIG. 3 is a schematic circuit diagram of a portion of the Combiner block of FIG. 2.

With reference to FIG. 3, the combiner circuit 3 of FIG. 2 is more fully described. When the digital control system senses an out of range condition, LOCK and LOCKN signals become active and close FET switches 32 and 33 in parallel to connect reference voltage $V_D$ to the node between resistor R1, 30 and capacitor C1, 31. $V_D$ is also connected to the gate of FET 37. When capacitor C1, 31, becomes fully charged, its voltage reached $V_D$. With $V_D$ applied to the gate of transistor 34, exactly the same current flows in FET 34 as in FET 37 and the current in FET 38 matches the current in FET 34. The analogue loop contributes $I_A$ to the current on line 8. The $I_D$ portion is contributed by the DAC 17. The analogue contribution satisfies the equation $I_A = i_2 - i_1$. Since at handover $i_2 = i_1$, it follows that $I_A = 0$. In this state, only the DAC 17 provides current 22' to line 8 to control the VCO. It is very important that C1 becomes fully charged during this period because this forces the control signal $V_A$ to be at the center of its adjustment range in preparation of the in range switching off of FET 32 and FET 33 which allows the signal $V_A$ on line 5 to take over and control the voltage into the gate 34 and the current in FET 34. So long as the Error Range Logic 15 senses that the frequency remains within 2.5%, the up/down counter 16 value doesn't change and $I_D$ remains constant. However the digital control circuit remains as a current contributor at all times and it can recapture control if necessary. The DAC 17 is a standard digital to analogue converter, such as is described more fully in U.S. Pat. No. 4,635,038, assigned to the same assignee, and incorporated herein by reference. The binary word A, B ... G into the DAC causes closures of appropriate DAC switches resulting in the selection of currents to be injected into node 43. on line 8, the current is the linear sum of $I_A + I_D$ which is employed to control the voltage into the VCO, designated VCON.

Figure 4:
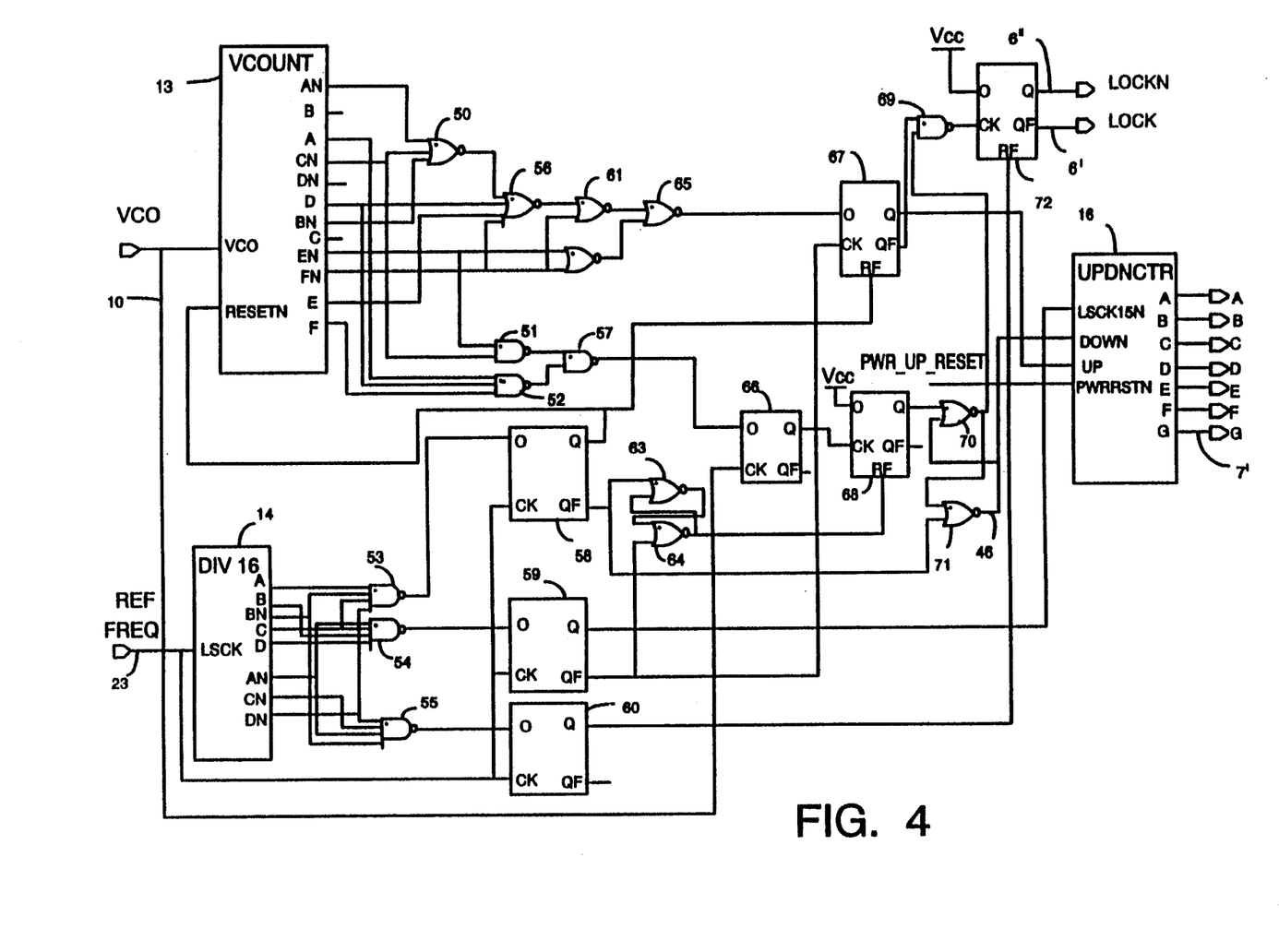
FIG. 4 is a schematic of the Digital Circuit of FIG. 2.

ERROR RANGE LOGIC (FIG. 4)

With reference to FIG. 4, the Error Range Logic 15 is disclosed. The DIV16 block 14 is a connection of four D flip flop stages A through D with appropriate combinatorial logic to divide the REF FREQ by 16. The pair of flip flop complement outputs, i.e., A and AN for each stage are coupled to combinatorial logic to generate the up 45 and down 46 commands to the UP/DOWN counter 16. The D flip flop 72 issues the Lock 6' and LOCKN 6" signals when the digital logic reflects that the frequency is within ±2.5% based on the parameters chosen in this embodiment.

Even if the VCO were very far from nominal 5*f the combinatorial logic of FIG. 4 will provide only one "up" or one "down" pulse to the UP/DOWN counter 16 for each cycle of the divide by 16 counter.

Figure 5:
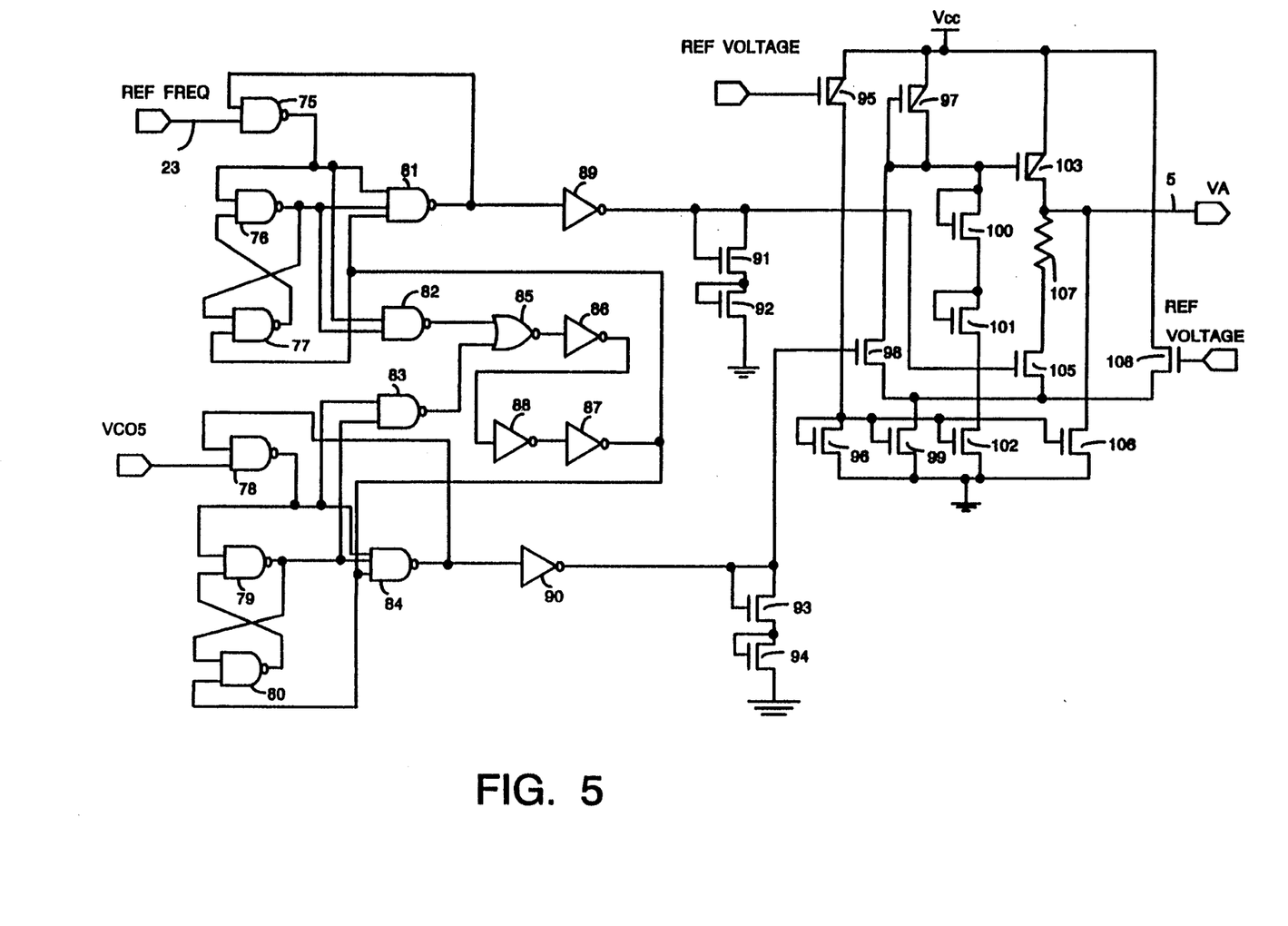
FIG. 5 is a schematic of the phase detector of the Analogue Circuit of FIG. 2 including the charge pump circuit.

PHASE DETECTOR (FIG. 5)

With reference to FIG. 5, the front end of the phase detector 12 (FIG. 2) includes combinatorial logic AND gates 75-84 and OR gates 85 coupled to invertors 86-87-88 to sense the phase, i.e., the non-coincidence in time of the rising edge of the FREQ REF as compared to the rising edges of the VC05 signal. VCO5 is the VCO output after it is divided down by the divide by 5 circuit 11. (FIG. 2) FETs 95-106 are the charge pump circuit. Any difference in edge arrival time of FREQ REF and VCO5 will result in a charge up current controlling the current flow in P channel FET 103' and charge down current will induce current in N channel FET 105. The difference between this current is fed to the VCO to control its phase via node $V_A$. The drain of FET 108 is connected to Vcc. The source of FET 108 is connected to the source of FET 105 at the node between FET 105 and FET 99. FET 108 assists in cutting off the current in FETs 98 and 105.

Figure 6:
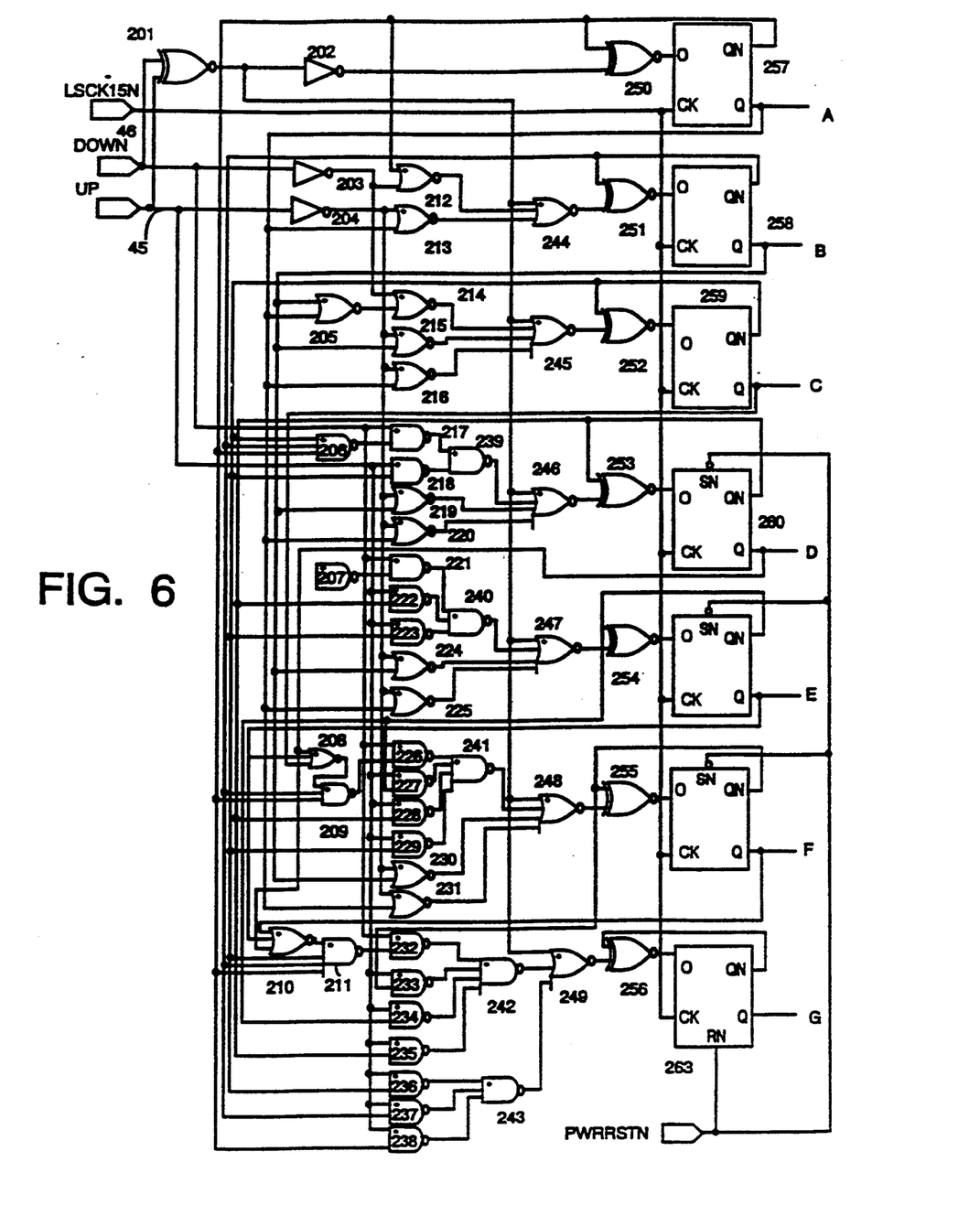
FIG. 6 is the detailed schematic of the UP/DOWN counter of FIG. 2.

UP/DOWN COUNTER (FIG. 6)

The UP/DOWN counter 16 of FIG. 2 is shown in detail in FIG. 6. Counter 16 is a standard counter which operates in response to the control up signal 45 (FIG. 4) and down signal 46 (FIG. 4). The counter provides outputs of the counter flip flop stages A,B,C,D,E,F,G with A being the output of the least significant stage to the DAC 17 in the Combiner 3.

All of the gates 202-256 on FIG. 6 are part of the combinatorial logic to enable the counter to move one step in either direction responsive to the up or down inputs. The combinatorial logic enables the solution of logic equations which define the state of the counter. By way of example, if the counter were a three stage counter, it would have the following possible states:

| A | B | C |
|---|---|---|
| 0 | 0 | 0 |
| 1 | 0 | 0 |
| 0 | 1 | 0 |
| 1 | 1 | 0 |
| 0 | 0 | 1 |
| 1 | 0 | 1 |
| 0 | 1 | 1 |

-continued

| A | B | C |
|---|---|---|
| 1 | 1 | 1 |

The logic equation for the "C" state register responsive to an up count can be expressed as $\overline{(\overline{A}+\overline{B})\oplus\overline{C}}$ where + is a logic "OR" operator and ⊕ is a logical "exclusive OR" operator. This equation can be converted to $\overline{(A+B)\oplus\overline{C}}$ which is more easily physically implemented by invertors and OR gates.

Similarly, the logic equation for the "C" state register responsive to the down count would be $\overline{(A+B)\oplus\overline{C}}$ which is the same as $\overline{(\overline{A}+\overline{B})\oplus\overline{C}}$. The same type of analysis for each of the A through G stages results in the combinatorial design shown in FIG. 6.

As indicated earlier, the PWRRSTN, FIG. 6, power up reset, is illustrated connected to flip flops 260, 261 and 262. This is to set certain flip flops on power up to a predetermined value to provide a current to bring the VCO to the nominal lock frequency at power up.

Figure 7:
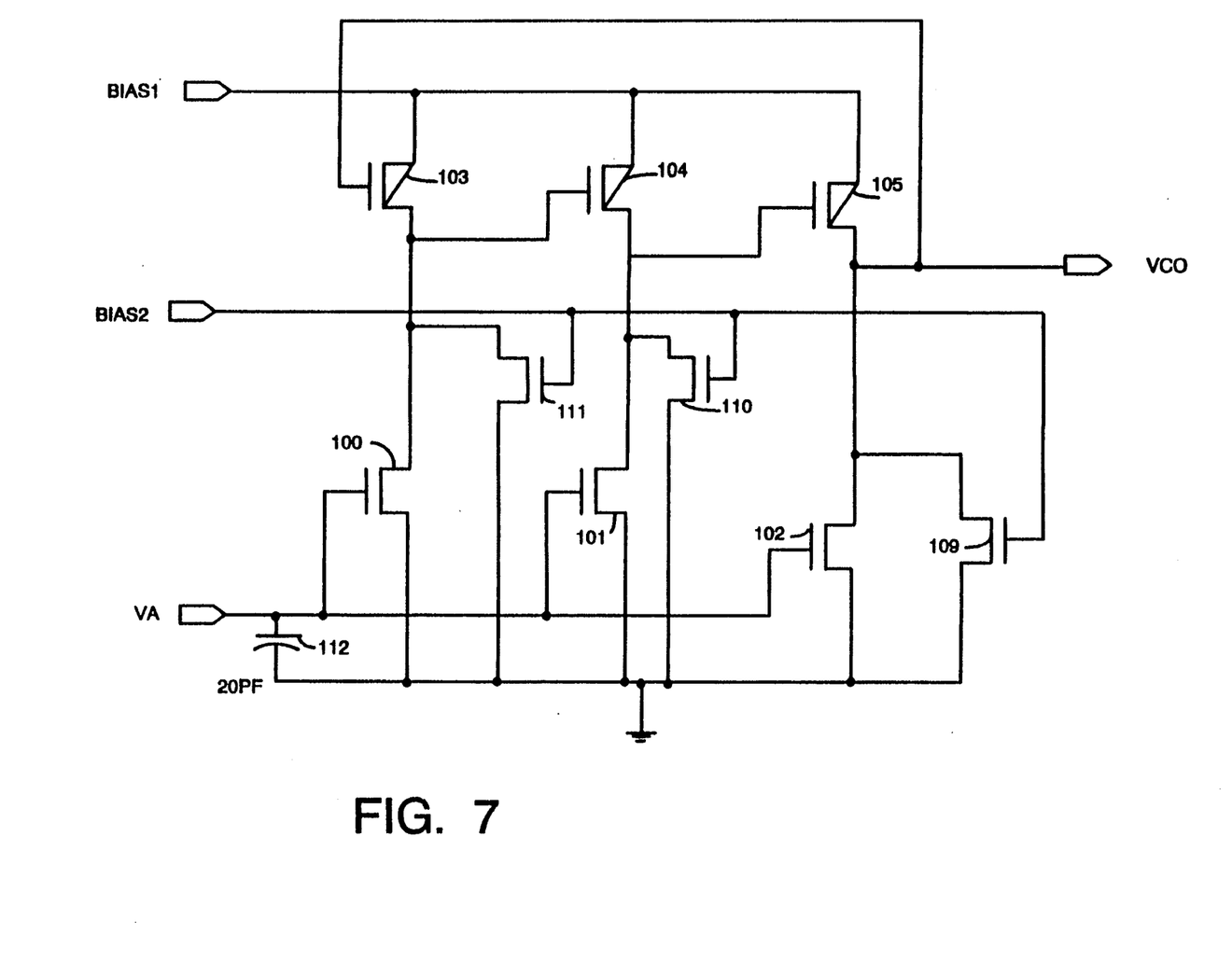
FIG. 7 is a detailed schematic of a VCO ring oscillator.

VCO (FIG. 7)

FET 103, 104 and 105 are interconnected in a ring oscillator configuration. The output $V_A$ of the combiner (FIG. 3) controls the phase and frequency by controlling the gate voltage of FETs 100, 101 and 102 which controls the rise times of the currents in the ring oscillator transistors 103–105. Voltages B1 and B2 are regulated and temperature compensated bias voltages. Transistors 109, 110 and 111 form part of the current sharing circuit for the rise time control Capacitor 112 connected to ground from the $V_A$ input is part of a low pass filter to control the noise and response time.

This invention has been described with reference to a particular embodiment. It is understood that other embodiments are within the invention and that it is intended that the scope of the invention be determined by the scope of the claims. With this in view,

I claim:

1. In a method for controlling handover to an analogue fine feedback loop in a phase locked loop (PLL) from a digital coarse control loop, said analogue fine feedback loop having a voltage controlled oscillator (VCO), said digital coarse control loop providing a digital control signal to a digital to analogue-converter (DAC) and said analogue fine feedback loop having a fine control signal having a range, said range having a middle point, said DAC providing a coarse control loop error signal, Said fine control signal and said coarse control loop error signal being connected to a combiner circuit, said combiner circuit having an output said combiner circuit output being connected to said VCO, Comprising digitally comparing in an error range logic circuit the digital representation of the frequency of said VCO to the digital representation of the frequency of a reference signal set nominally at 1/5 times the VCO frequency, and providing an incrementing/decrementing signal from said error range logic circuit to an up/down counter indicative of whether said VCO frequency was greater or lesser than 5 times said frequency of said reference signal responsive to said step of digitally comparing;

integrating said incrementing/decrementing signal in said up/down counter, said up/down counter providing a multibit digital word to said DAC;

providing from said error range logic circuit a binary output control logic signal to said combiner circuit responsive to said step of digitally comparing wherein said binary output control logic signal is set to a true state when the frequency comparison made in said step of digitally comparing is within a preselected percentage;

summing said fine control control signal and said coarse control loop error signal in said combiner circuit;

centering said fine control signal at said middle point whenever said digital coarse control loop is in control of said PPL; and handling over control of said PLL to said analogue fine feedbacks control loop responsive to issuance of said binary output control logic signal.

2. The method of claim 1 wherein said step of digitally comparing includes
counting the number of VCO cycles which occur during a period of eight cycles of said reference signal;
sending an incrementing signal to said up/down counter when the count obtained during said step of counting the number of VCO cycles is 39 or less than 39 and sending a decrementing signal to said up/down counter when said count obtained during said step of counting of the number of VCO cycles is 41 or greater than 41.

3. In a phase locked loop (PLL) including a voltage controlled oscillator (VCO) having an input and an output, a coarse digital feedback loop and a fine analogue feedback loop, each said coarse digital feedback loop and fine analogue feedback loop having means to compare the VCO output to another signal and to output a coarse loop control signal and a fine loop control signal respectively, said fine loop control signal having two polarities and a null at the center of its range, and a combiner circuit for receiving said coarse loop control signal and said fine loop control signal said coarse digital feedback loop includes a DAC, said DAC for converting a digital signal input to a DAC analogue signal output, said DAC analog signal output being combined with said fine loop control signal, THE IMPROVEMENT COMPRISING:

said coarse digital feedback loop having means to also provide to said combiner circuit a control logic signal indicative of whether the frequency of said VCO is within a preselected percentage of the frequency of said another signal;

said combiner circuit includes means responsive to said control logic signal to maintain said fine loop control signal at the center of its control range until said control logic signal indicates that the frequency of said VCO is within said preselected percentage of the frequency of said another signal;

said combiner circuit includes means to add together said coarse loop control signal and said fine loop control signal to provide a sum signal and to send said sum signal to said VCO; said means to add together including a series connected circuit connected across a fixed voltage, said series connected circuit comprising a series resistor and an N-channel FET, said N-channel FET having source, gate and drain terminals, said N-channel FET drain terminal being connected to an output node, a P- channel FET having a source, gate and drain terminals, said P-channel FET drain terminal being connected to said output node, and wherein said output node is connected to said DAC analogue signal output.

4. The PLL of claim 3 wherein said means responsive to said control logic signal to maintain said fine loop control at the center of its range comprises means to connect said gate of said P channel FET and said gate of said N channel FET to the same voltage value until said coarse digital feedback loop provides said control logic signal to said combiner circuit indicating that said frequency of said VCO is within said predetermined percentage of said another signal.

5. The PLL of claim 4, wherein said another signal is a reference frequency signal which reference frequency is lower than the frequency of said VCO.

6. The PLL of claim 5 wherein the frequency of said VCO equals five times said reference frequency.

* * * * *